United States Patent
Chen et al.

(10) Patent No.: US 9,805,815 B1
(45) Date of Patent: Oct. 31, 2017

(54) ELECTRICAL FUSE BIT CELL AND MASK SET

(71) Applicant: TAIWAN SEMICONDUCTOR MANUFACTURING COMPANY, LTD., Hsinchu (TW)

(72) Inventors: Po-Hung Chen, Taipei (TW); Liang Chuan Chang, Hsinchu (TW); Wei-Fen Pai, Hsinchu (TW); Bai-Mei Chang, Zhubei (TW); Shao-Yu Chou, Chu Pei (TW); Ren-Fen Tsui, Yungho (TW); Dian-Sheg Yu, Hsinchu (TW); Shih-Guo Shen, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/240,135

(22) Filed: Aug. 18, 2016

(51) Int. Cl.
*G11C 17/00* (2006.01)
*G11C 17/16* (2006.01)
*H01L 27/02* (2006.01)
*G03F 1/36* (2012.01)

(52) U.S. Cl.
CPC .......... *G11C 17/16* (2013.01); *G03F 1/36* (2013.01); *G11C 17/165* (2013.01); *H01L 27/0207* (2013.01)

(58) Field of Classification Search
CPC ... G11C 17/16; G11C 17/165; H01L 27/0207; G03F 1/36
See application file for complete search history.

(56) References Cited

U.S. PATENT DOCUMENTS

| | | | |
|---|---|---|---|
| 6,911,360 B2* | 6/2005 | Li | H01L 23/5256 257/379 |
| 8,421,205 B2 | 4/2013 | Yang | |
| 8,564,023 B2* | 10/2013 | Im | G11C 17/16 257/209 |
| 8,661,389 B2 | 2/2014 | Chern et al. | |
| 8,698,205 B2 | 4/2014 | Tzeng et al. | |
| 8,760,955 B2* | 6/2014 | Liao | G11C 17/16 365/148 |
| 8,826,212 B2 | 9/2014 | Yeh et al. | |
| 8,836,141 B2 | 9/2014 | Chi et al. | |
| 8,875,076 B2 | 10/2014 | Lin et al. | |
| 9,147,029 B2 | 9/2015 | Ke et al. | |
| 2013/0039117 A1* | 2/2013 | Lin | G11C 17/18 365/96 |
| 2014/0204649 A1* | 7/2014 | Kanda | G11C 17/165 365/96 |
| 2014/0264924 A1 | 9/2014 | Yu et al. | |
| 2014/0282289 A1 | 9/2014 | Hsu et al. | |
| 2015/0279453 A1 | 10/2015 | Fujiwara et al. | |
| 2015/0318241 A1 | 11/2015 | Chang et al. | |
| 2015/0347659 A1 | 12/2015 | Chiang et al. | |
| 2015/0357279 A1 | 12/2015 | Fujiwara et al. | |
| 2016/0012169 A1 | 1/2016 | Chiang et al. | |

* cited by examiner

Primary Examiner — Toan Le
(74) Attorney, Agent, or Firm — Hauptman Ham, LLP

(57) ABSTRACT

A bit cell includes a program device comprising a first source/drain region and a second source/drain region separated by a first channel. The first source/drain region, the second source/drain region, and the first channel are positioned along a first direction. The bit cell also includes an electrical fuse (eFuse) having a conduction path along the first direction. A conductive element is electrically connected with the first source/drain region and one end of the eFuse.

20 Claims, 5 Drawing Sheets

ELECTRICAL FUSE BIT CELL AND MASK SET

BACKGROUND

Many integrated circuits (ICs) are made up of millions of interconnected devices, such as transistors, resistors, capacitors, and diodes, on a single chip of semiconductor substrate. It is generally desirable that ICs operate as fast as possible, and consume as little power as possible. Semiconductor ICs often include one or more types of memory, such as complementary metal-oxide-semiconductor (CMOS) memory, anti-fuse memory, and E-fuse memory.

One-time-programmable ("OTP") memory elements are used in ICs to provide non-volatile memory ("NVM"). Data in NVM are not lost when the IC is turned off. NVM allows an IC manufacturer to store lot number and security data on the IC, for example, and is useful in many other applications. One type of NVM utilizes an electrical fuse (eFuse).

EFuses are usually integrated into semiconductor ICs by using a narrow stripe (commonly also called a "fuse link") of conducting material (metal, poly-silicon, etc.) between two pads. Applying a program current to the eFuse destroys (i.e., fuses) the link, thus changing the resistivity of the eFuse. This is commonly referred to as "programming" the eFuse. The fuse state (i.e., whether it has been programmed) can be read using a sense circuit.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
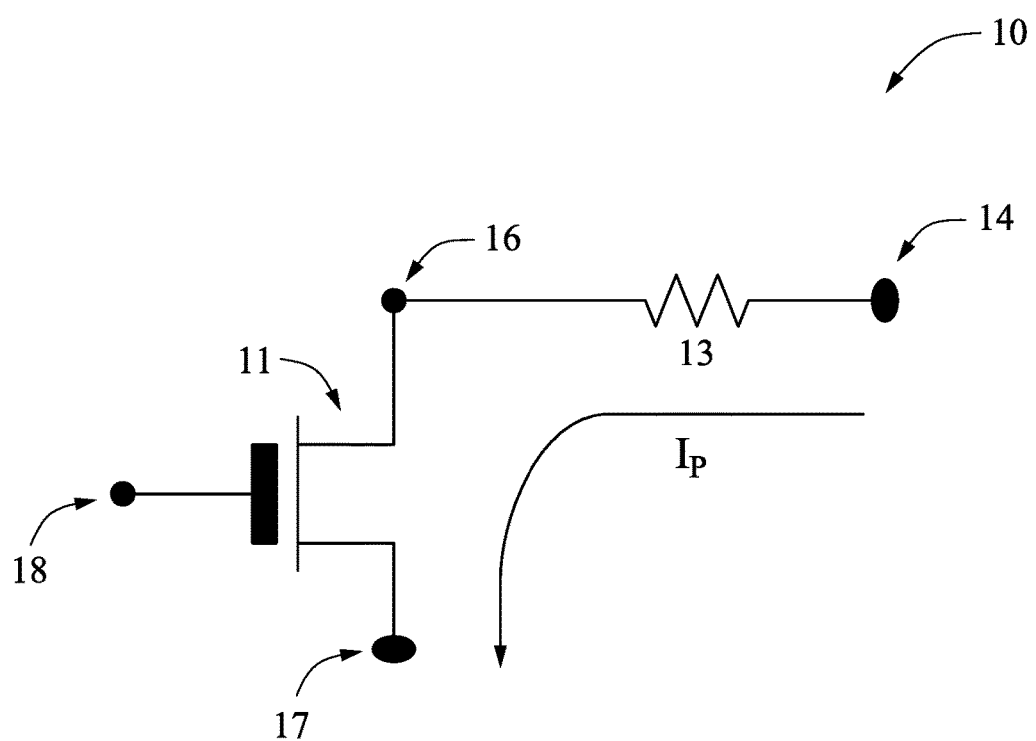
FIG. 1 is a diagram of an eFuse bit cell, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

A bit cell includes a program device including a first source/drain region and a second source/drain region separated by a first channel. The first source/drain region, the second source/drain region, and the first channel are positioned to be aligned with each other along a first direction. The bit cell also includes an eFuse including a conduction path along the first direction, and a conductive element electrically connected with the first source/drain region and one end of the eFuse. The eFuse and the program device are aligned with each other along a second direction perpendicular to the first direction. In some embodiments, a bit cell includes a read device aligned with the eFuse and the program device along the second direction.

FIG. 1 is a diagram of an eFuse bit cell 10, in accordance with some embodiments. EFuse bit cell 10 includes a program device 11 in series with an eFuse 13. EFuse 13 includes two terminals. A first terminal of eFuse 13 is electrically connected with a node 14 and a second terminal of eFuse 13 is electrically connected with a node 16. Program device 11 includes three terminals. A first terminal of program device 11 is electrically connected with node 16, a second terminal of program device 11 is electrically connected with a node 17, and a third terminal of program device 11 is electrically connected with a node 18.

In some embodiments, program device 11 is a transistor. In various embodiments, program device 11 is an NMOS, PMOS, or other type of transistor. In some embodiments, one of the first terminal or second terminal of program device 11 is a source terminal and the other of the first terminal or second terminal of program device 11 is a drain terminal. In some embodiments, the third terminal of program device 11 is a gate terminal and node 18 is configured to receive a signal that operates to control current flow through program device 11.

In some embodiments, program device 11 includes a fourth terminal (not shown). In some embodiments, a fourth terminal of program device 11 is a substrate terminal. In some embodiments, a fourth terminal of program device 11 is a substrate terminal electrically connected with node 16 or node 17.

When eFuse 13 is not programmed (i.e., closed), the resistance value of eFuse 13 is relatively small. In some embodiments, the closed resistance value of eFuse 13 is about 5Ω to 200Ω. In contrast, after eFuse 13 is programmed (i.e., open), the resistance value of eFuse 13 is relatively large. In some embodiments, the open resistance value of eFuse 13 is about 1 kΩ to 100 MΩ.

Each of node 14 and node 17 is configured to transfer voltage values and currents between eFuse bit cell 10 and external circuitry (not shown). In some embodiments, one or both of node 14 or node 17 is electrically connected with a power source. In some embodiments, one of node 14 or node 17 is electrically connected with a sense amplifier. In some embodiments, one of node 14 or node 17 is electrically connected with a ground reference.

In a program operation of eFuse bit cell 10, program device 11 is turned on, and a program (or programming) voltage, $V_P$ (not labeled), is applied at one of node 14 or node 17 while the other of node 14 or node 17 is maintained at a reference voltage level, either by a power source or by an electrical connection with ground. A current $I_P$ flows through node 14, Fuse 13, node 16, program device 11, and node 17. As a result of a sufficiently large programming value of current $I_P$, eFuse 13 is programmed by being fused to either have a high resistance value or be completely open. In some embodiments, voltage $V_P$ has a value of about 1.8 V. In some embodiments, a programming value of current $I_P$ is about 20 mA.

In a read operation of eFuse bit cell 10, in some embodiments, program device 11 is turned on and a power source is electrically connected with one of node 14 or node 17 while the other of node 14 or node 17 is maintained at a reference voltage level, either by another power source or by an electrical connection with ground. The power source is configured to induce a target read value of current $I_P$ through node 14, eFuse 13, node 16, program device 11, and node 17.

In some embodiments, the target read value of current $I_P$ in a read operation is about 0.5 mA. If eFuse 13 is completely open, current $I_P$ has an actual value near zero and a voltage generated between node 14 and node 17 has a value limited by the one or more power sources.

A voltage detection device (not shown) is electrically connected with at least one of node 14 or node 17 to detect the resultant voltage value in a read operation. In some embodiments, the voltage detection device is a sense amplifier. The detected voltage value reveals the data stored in eFuse bit cell 10. For example, if eFuse 13 is programmed, the high resistance or open state of eFuse 13 results in a high voltage value between node 14 and node 17. If eFuse 13 is not programmed, however, the low resistance of eFuse 13 results in a low voltage value between node 14 and node 17.

Figure 2:
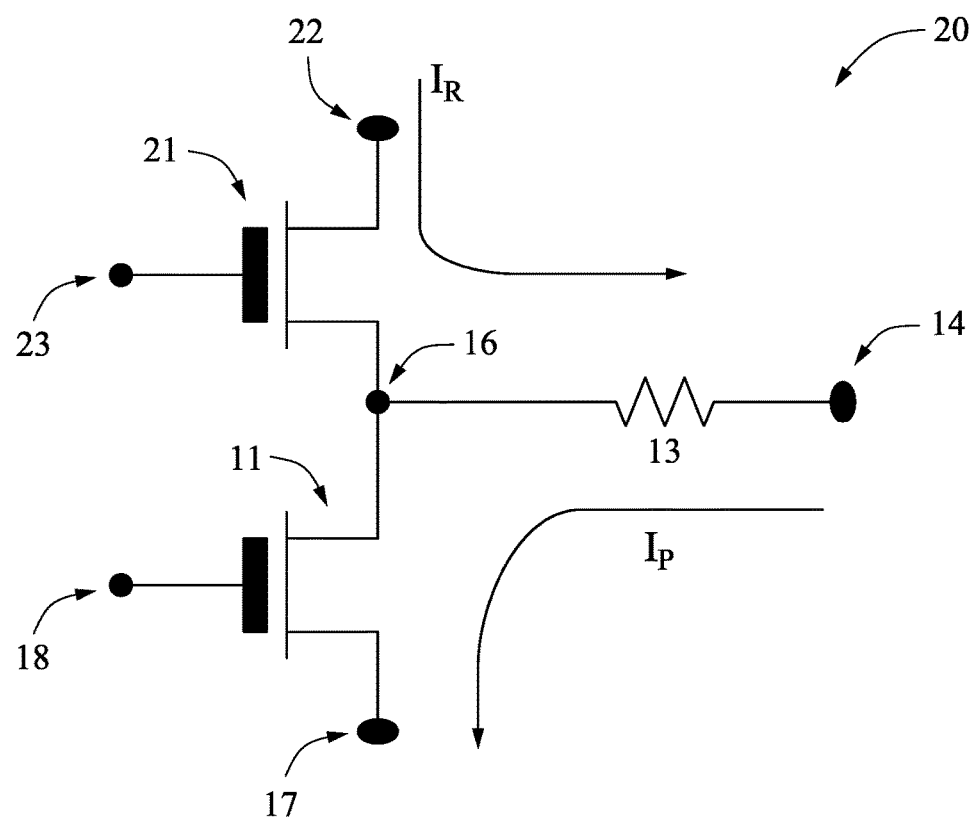
FIG. 2 is a diagram of an eFuse bit cell, in accordance with some embodiments.

FIG. 2 is a diagram of an eFuse bit cell 20, in accordance with some embodiments. EFuse bit cell 20 includes the circuit elements of eFuse bit cell 10, as described above with respect to FIG. 1. In addition to the circuit elements of eFuse bit cell 10, eFuse bit cell 20 includes read device 21 electrically connected between node 16 and a node 22 and between node 16 and a node 23.

Read device 21 includes three terminals. A first terminal of read device 21 is electrically connected with node 22, a second terminal of read device 21 is electrically connected with node 16, and a third terminal of read device 21 is electrically connected with node 23.

In some embodiments, read device 21 is a transistor. In various embodiments, read device 21 is an NMOS, PMOS, or other type of transistor. In some embodiments, one of the first terminal or second terminal of read device 21 is a source terminal and the other of the first terminal or second terminal of read device 21 is a drain terminal. In some embodiments, the third terminal of read device 21 is a gate terminal and node 23 is configured to receive a signal that operates to control current flow through read device 21.

In some embodiments, read device 21 includes a fourth terminal (not shown). In some embodiments, a fourth terminal of read device 21 is a substrate terminal. In some embodiments, a fourth terminal of read device 21 is a substrate terminal electrically connected with node 16, node 17, or node 22.

In a program operation of eFuse bit cell 20, read device 21 is turned off and is therefore disconnected from node 16, eFuse 13, and program device 11. Otherwise, the program operation of eFuse bit cell 20 is the same as the program operation of eFuse bit cell 10 described above with respect to FIG. 1.

In a read operation of eFuse bit cell 20, in some embodiments, program device 11 is turned off, and is therefore electrically disconnected from node 16, eFuse 13, and read device 21. Read device 21 is turned on and a power source is electrically connected with one of node 14 or node 22 while the other of node 14 or node 22 is maintained at a reference voltage level, either by another power source or by an electrical connection with ground. The power source is configured to induce a target read value of current $I_R$ through node 14, eFuse 13, node 16, read device 21, and node 22. In some embodiments, the target read value of current $I_R$ in a read operation is about 0.5 mA. If eFuse 13 is completely open, current $I_R$ has an actual value near zero and a voltage generated between node 14 and node 22 has a value limited by the one or more power sources.

A voltage detection device (not shown) is electrically connected with at least one of node 14 or node 22 to detect the resultant voltage value in a read operation. In some embodiments, the voltage detection device is a sense amplifier. The detected voltage value reveals the data stored in eFuse bit cell 20. For example, if eFuse 13 is programmed, the high resistance or open state of eFuse 13 results in a high voltage value between node 14 and node 22. If eFuse 13 is not programmed, however, the low resistance of eFuse 13 results in a low voltage value between node 14 and node 22.

For both the embodiments of eFuse bit cell 10 and the embodiments of eFuse bit cell 20, program device 11 has a size that includes one or more minimum dimensions so as to be able to conduct the programming value of current $I_P$ without overheating or being damaged. In some embodiments, a minimum dimension is a minimum channel width.

In some embodiments, the size or sizes of programming device 11 and, if present, read device 21 is/are selected based on a simulation. For example, a programming value of current $I_P$ sufficient to break (i.e., to program) eFuse 13 is determined. The size of program device 11 is then selected based on the determined programming value of current $I_P$.

Figure 3:
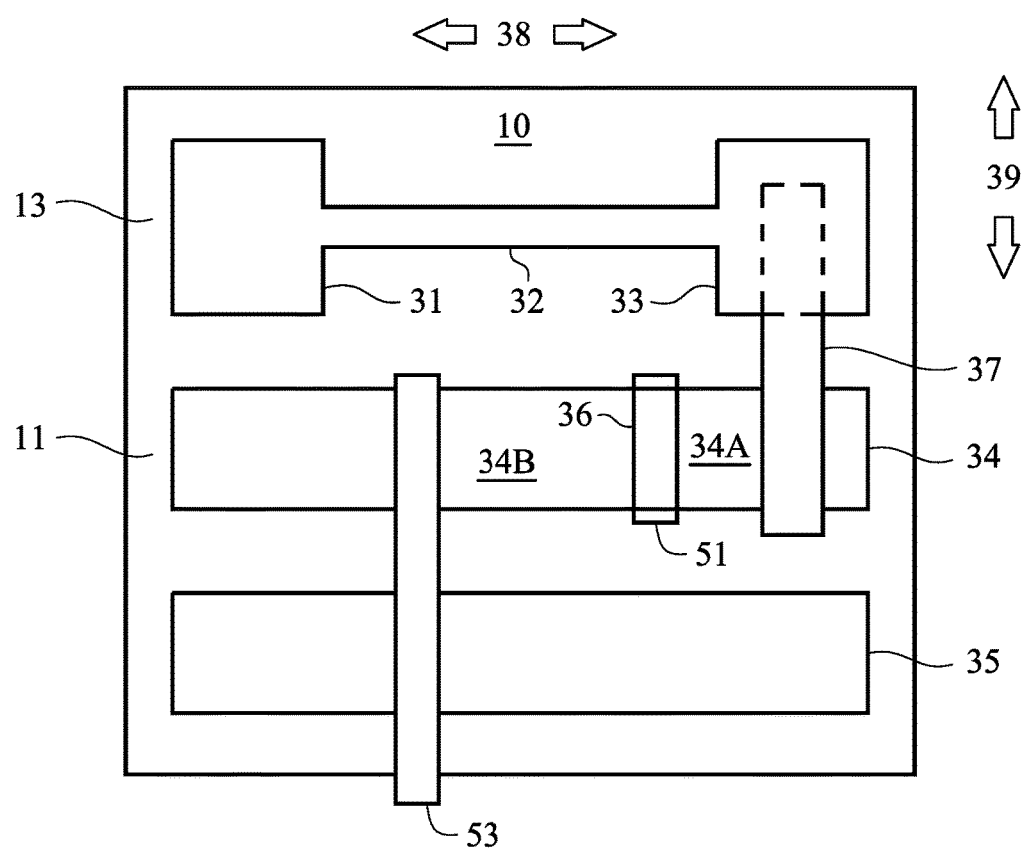
FIG. 3 is a layout diagram of an eFuse bit cell, in accordance with some embodiments.

FIG. 3 is a layout diagram of an eFuse bit cell, e.g., the eFuse bit cell 10 of FIG. 1, in accordance with some embodiments. As depicted in FIG. 3, eFuse bit cell 10 includes eFuse 13, program device 11, an active region 35, a conductive element 37, and a conductive element 53. A first direction 38 and a second direction 39, perpendicular to first direction 38, are depicted in FIG. 3.

EFuse 13 includes a first end 31, a conductive path 32, and a second end 33. Conductive path 32 electrically connects first end 31 and second end 33 and is oriented along first direction 38. In some embodiments, eFuse 13 is part of a second metal layer and second end 33 overlies conductive element 37. In some embodiments, eFuse 13 is part of a metal-zero layer over polysilicon and conductive element 37 overlies second end 33. In some embodiments, eFuse 13 comprises polysilicon and conductive element 37 overlies second end 33.

Program device 11 includes an active region 34, which includes a first source/drain region 34A and a second source/drain region 34B separated by a first channel 36. First channel 36 is defined in part by a first gate 51 overlapping active region 34. First channel 36 has a channel width oriented along second direction 39, also referred to as a channel width direction. A channel width direction is therefore perpendicular to the orientation of conductive path 32. First gate 51 is oriented along second direction 39. First gate 51, one or more vias, and associated metal interconnects correspond to node 18 of FIG. 1.

Active region 35 is a well connection, or well pick-up, electrically connected to a well (not shown) in which program device 11 is positioned, in some embodiments. In some embodiments, eFuse bit cell 10 does not include active region 35. Active regions 34 and 35 are sometimes referred to as oxide diffusion regions.

Conductive element 37 overlaps second end 33 and first source/drain region 34A, and is oriented along second direction 39. Conductive element 37 is part of a first metal layer and is electrically connected to each of second end 33 and first source/drain region 34A by one or more contacts and/or vias (not shown).

First end 31, one or more vias, and associated metal interconnects correspond to node 14 of FIG. 1. Second end 33, one or more vias, and conductive element 37 correspond to node 16 of eFuse bit cell 10 of FIG. 1.

Conductive element 53 is part of a first metal layer and is oriented along second direction 39. Conductive element 53 is electrically connected to second source/drain region 34B by one or more contacts and/or vias (not shown). Conductive element 53, one or more contacts and/or vias, and associated metal interconnects correspond to node 17 of FIG. 1.

Conductive element 53 overlaps at least part of active region 35. In some embodiments, conductive element 53 does not overlap active region 35. In some embodiments, conductive element 53 is electrically connected with active region 35.

In various embodiments, an integrated circuit fabricated based on the layout design depicted in FIG. 3 includes additional elements such as, but not limited to, additional source/drain regions and channels, gate structures, substrate contacts, vias, and multiple layers of metal interconnects. In some embodiments, an integrated circuit fabricated based on the layout design depicted in FIG. 3 has five metal layers.

As shown in FIG. 3, eFuse 13, program device 11, and active region 35 are positioned so as to be aligned with each other along second direction 39. First source/drain region 34A, first channel 36/first gate 51, and second source/drain region 34B are positioned so as to be aligned with each other along first direction 38.

The orientations along first direction 38 and second direction 39 shown in FIG. 3 are non-limiting examples. Other frames of reference in which the orientation of conductive path 32 is perpendicular to the orientation of first channel 36 and to the alignment of eFuse 13 and program device 11 are within the scope of the present disclosure.

Because eFuse 13 is aligned with program device 11 along the channel width direction of program device 11, and has conductive path 32 oriented perpendicularly to the alignment direction, conductive element 37 directly spans the distance between second end 33 and first source/drain region 34A. Further, because conductive element 37 is part of the first metal layer and eFuse 13 is part of a metal or polysilicon layer adjacent to the first metal layer, a single level of vias and/or contacts electrically connects conductive element 37 to the other components that correspond to node 16 of bit cell 10 of FIG. 1.

As a result of the relatively direct electrical connections, node 16 of eFuse bit cell 10 of FIG. 1 has a resistance value lower than resistance values based on configurations in which an eFuse is positioned in parallel with a program device channel, in which case electrical connections are made with third metal layer conductive elements and multiple via/contact levels to bridge underlying structures.

Because of a lowered node 16 resistance value, resistance values of other elements in the program current path of eFuse bit cell 10 can be increased while maintaining a constant overall path resistance. Therefore, in comparison to other configurations, the ability to program eFuse 13 can be maintained with a smaller program device and/or narrower interconnect elements such as those corresponding to node 14.

The short conductive element 37, small program device 11, and narrow interconnect elements each contribute to an overall size of eFuse bit cell 10 that is smaller than the sizes of other bit cells based on configurations in which an eFuse is positioned in parallel with a program device channel.

Figure 4:
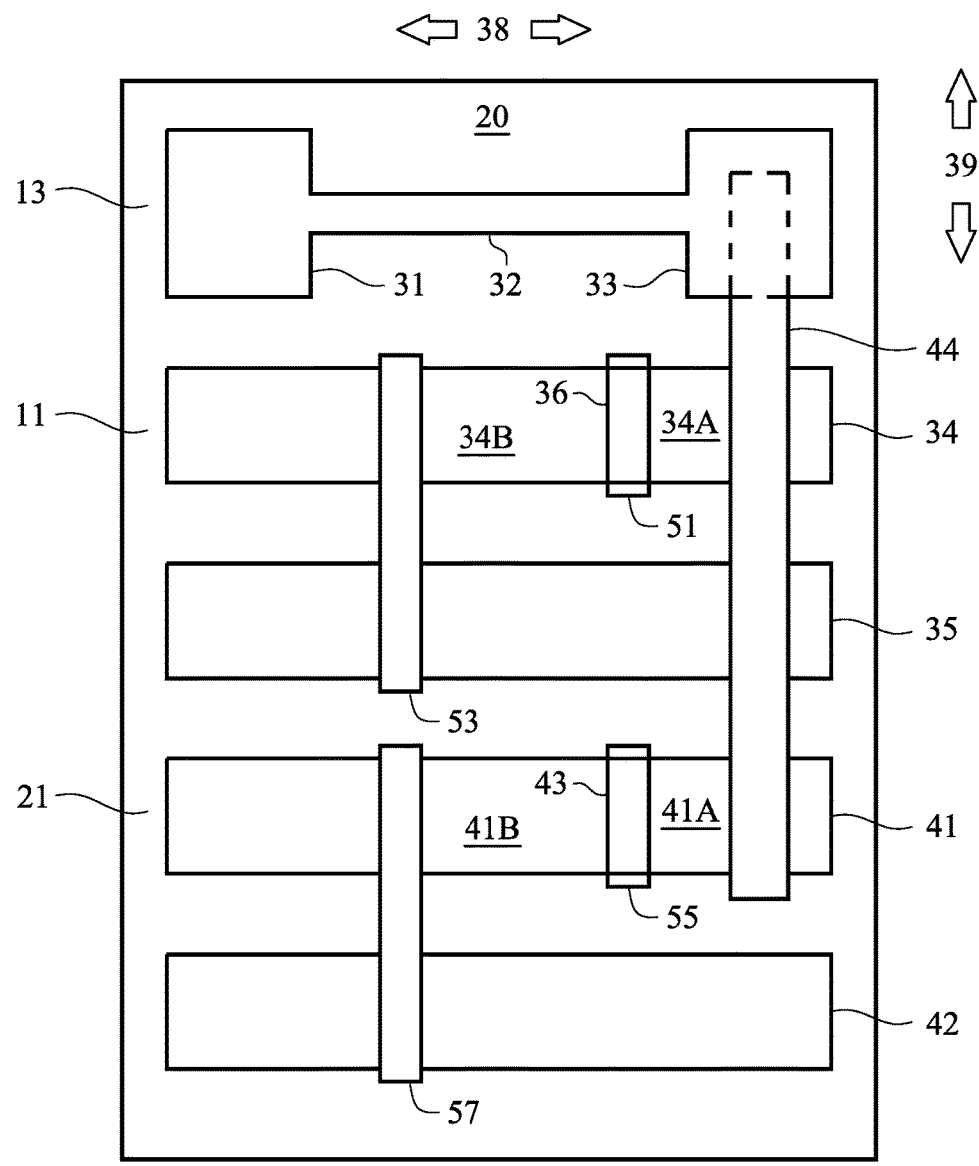
FIG. 4 is a layout diagram of an eFuse bit cell, in accordance with some embodiments.

FIG. 4 is a layout diagram of an eFuse bit cell, e.g., the eFuse bit cell 20 of FIG. 2, in accordance with some embodiments. As depicted in FIG. 4, eFuse bit cell 20 includes eFuse 13, program device 11, active region 35, and conductive element 53, described above with respect to the layout diagram of eFuse bit cell 10 depicted in FIG. 3. In addition to the elements of the layout diagram of eFuse bit cell 10, eFuse bit cell 20 includes a read device 21, an active region 42, and a conductive element 57. EFuse bit cell 20 also includes a conductive element 44 instead of conductive element 37. First direction 38 and second direction 39 are depicted in FIG. 4.

Read device 21 includes an active region 41, which includes a third source/drain region 41A and a fourth source/drain region 41B separated by a second channel 43. Second channel 43 is defined in part by a second gate 55 overlapping active region 41. Second channel 43 has a channel width oriented along second direction 39, also referred to as the channel width direction perpendicular to the orientation of conductive path 32. Second gate 55 is oriented along second direction 39. Second gate 55, one or more vias, and associated metal interconnects correspond to node 23 of FIG. 2.

Active region 42 is a well connection, or well pick-up, electrically connected to a well (not shown) in which program device 21 is positioned, in some embodiments. In some embodiments, eFuse bit cell 20 does not include active region 42. Active regions 41 and 42 are sometimes referred to as oxide diffusion regions.

Conductive element 44 overlaps second end 33, first source/drain region 34A, active region 35, and third source/drain region 41A. Conductive element 44 is part of a first metal layer and is oriented along second direction 39. In some embodiments, conductive element 44 overlies second end 33. In some embodiments, second end 33 overlies conductive element 44. Conductive element 44 is electrically connected with each of second end 33, first source/drain region 34A, and third source/drain region 41A by one or more contacts and/or vias (not shown). Conductive element 44 is electrically separate from active region 35.

In some embodiments, conductive element 44 is a single conductive element as shown in FIG. 4. In some embodiments, conductive element 44 is a plurality of conductive elements configured to electrically connect second end 33, first source/drain region 34A, and third source/drain region 41A with each other.

Conductive element 57 is part of a first metal layer and is oriented along second direction 39. Conductive element 57 is electrically connected to fourth source/drain region 41B by one or more vias (not shown). Conductive element 57, one or more vias, and associated metal interconnects correspond to node 22 of FIG. 2.

Conductive element 57 overlaps at least part of active region 42. In some embodiments, conductive element 57 does not overlap active region 41. In some embodiments, conductive element 57 is electrically connected with active region 41.

In various embodiments, an integrated circuit fabricated based on the layout design depicted in FIG. 4 includes additional elements such as, but not limited to, additional source/drain regions and channels, gate structures, substrate contacts, vias, and multiple layers of metal interconnects. In some embodiments, an integrated circuit fabricated based on the layout design depicted in FIG. 4 has five metal layers.

As shown in FIG. 4, read device 21 is positioned so as to be aligned with eFuse 13 and program device 11 along second direction 39. First source drain region 34A is positioned between eFuse 13 and third source/drain region 41A. Third source/drain region 41A, second channel 43/second gate 55, and fourth source/drain region 41B are positioned so as to be aligned with each other along first direction 38.

Second end 33, one or more vias, and conductive element 44 correspond to node 16 of eFuse bit cell 20 of FIG. 2. Because read device 21 is turned off during a program operation, the additional length and connections of conductive element 44 as compared to conductive element 37 do not contribute to path resistance during a program operation using program device 11.

Because the elements in common to the layouts of eFuse bit cell 10 and eFuse bit cell 20 have the configuration described above with respect to eFuse bit cell 10, and the additional elements of eFuse 20 do not contribute to path resistance during a program operation, the layout of eFuse bit cell 20 shown in FIG. 4 has the advantages described above with respect to the layout of eFuse bit cell 10 shown in FIG. 3.

Figure 5:
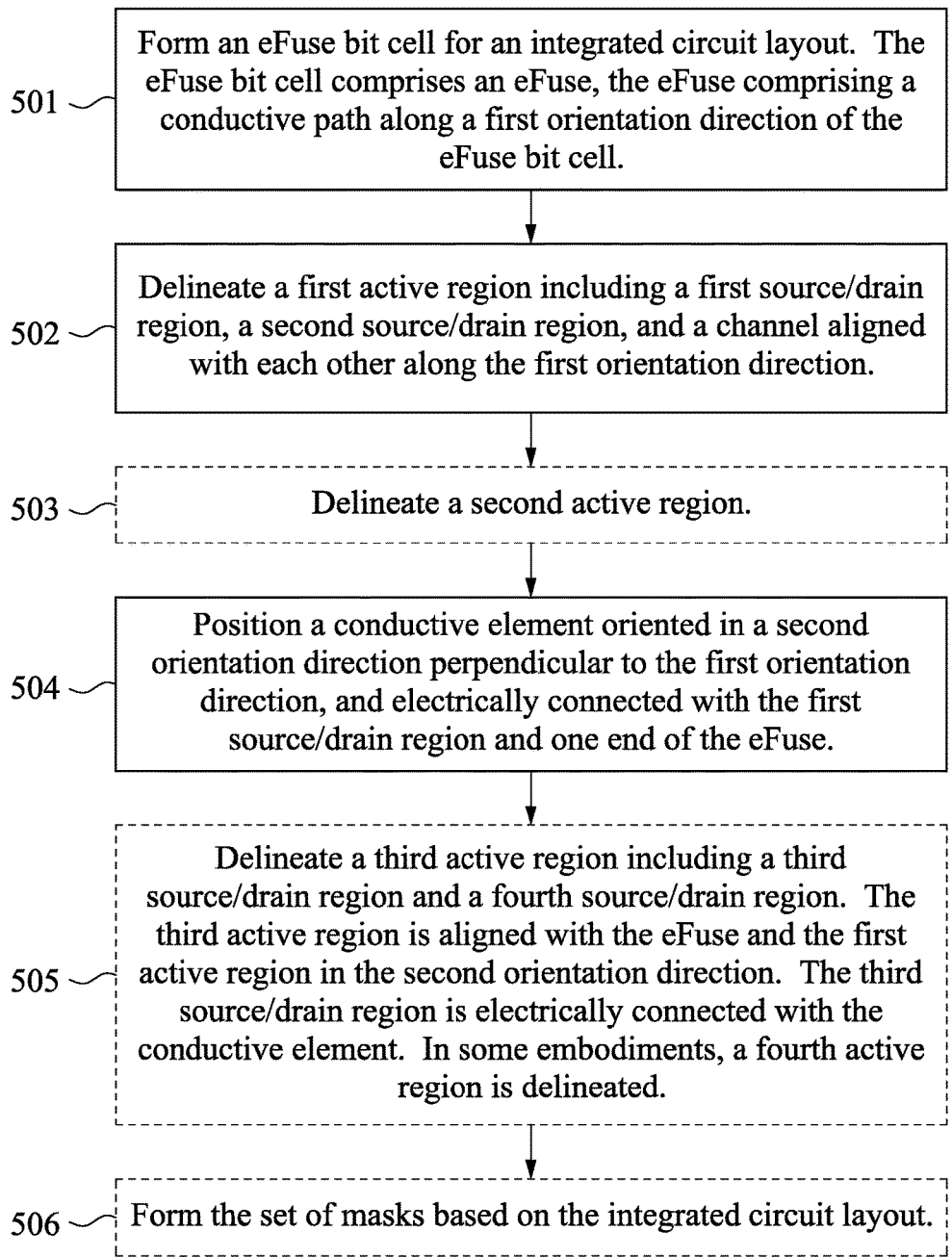
FIG. 5 is a flow chart of a method of forming a set of masks corresponding to an integrated circuit layout, in accordance with some embodiments.

FIG. 5 is a flow chart of a method 500 of generating an integrated circuit layout, in accordance with some embodiments. In some embodiments, generating an integrated circuit layout and the various elements in accordance with the operations of method 500 comprises accessing, creating, or modifying one or more electronic files containing data corresponding to an integrated circuit layout. In some embodiments, method 500 is a method of forming a set of masks based on an integrated circuit layout.

At operation 501, an eFuse bit cell is formed for an integrated circuit layout. The eFuse bit cell has a first orientation direction and a second orientation direction perpendicular to the first orientation direction. The eFuse bit cell includes an eFuse comprising a conductive path along the first orientation direction.

In some embodiments, forming an eFuse bit cell includes forming eFuse bit cell 10 including eFuse 13, described above with respect to FIG. 1. In some embodiments, forming an eFuse bit cell includes forming eFuse bit cell 20 including eFuse 13, described above with respect to FIG. 2.

At operation 502, a first active region is delineated. The first active region includes a first source/drain region, a second source/drain region, and a channel positioned so as to be aligned with each other along the first orientation direction. The channel has a channel width direction oriented along the second orientation direction.

In some embodiments, delineating a first active region comprises delineating first active region 34, described above with respect to eFuse bit cell 10 and eFuse bit cell 20.

At operation 503, in some embodiments, a second active region is delineated. In some embodiments, delineating a second active region comprises delineating second active region 35, described above with respect to eFuse bit cell 10 and eFuse bit cell 20.

At operation 504, a conductive element is positioned. The conductive element is oriented in the second orientation direction and is electrically connected with the first source/drain region and one end of the eFuse.

In some embodiments, positioning a conductive element includes positioning conductive element 37 electrically connected with second end 33, described above with respect to eFuse bit cell 10. In some embodiments, positioning a conductive element includes positioning conductive element 44 electrically connected with second end 33, described above with respect to eFuse bit cell 20.

At operation 505, in some embodiments, a third active region is delineated. Third active region includes a third source/drain region, a fourth source/drain region, and another channel positioned so as to be aligned with each other along the first orientation direction. The third active region is aligned with the eFuse and the first active region along the second orientation direction. The third source/drain region is electrically connected with the conductive element.

In some embodiments, delineating a third active region comprises delineating third source/drain region 41A electrically connected with conductive element 44, described above with respect to eFuse bit cell 20. In some embodiments, delineating a third active region comprises delineating fourth active region 42, described above with respect to eFuse bit cell 20.

At operation 506, in some embodiments, the set of masks is formed based on the integrated circuit layout. In some embodiments, forming the set of masks includes forming the set of masks based on eFuse bit cell 10. In some embodiments, forming the set of masks includes forming the set of masks based on eFuse bit cell 20.

In some embodiments, a bit cell comprises a program device comprising a first source/drain region and a second source/drain region separated by a first channel, the first source/drain region, the second source/drain region, and the first channel being positioned along a first direction. The bit cell further comprises an electrical fuse (eFuse) comprising a conduction path along the first direction, and a conductive element electrically connected with the first source/drain region and one end of the eFuse.

In some embodiments, an integrated circuit comprises a first transistor comprising a first source/drain region and a second source/drain region separated by a channel, the channel having a channel width direction, and an electrical fuse (eFuse) comprising a conduction path perpendicular to the channel width direction. The integrated circuit further comprises a conductive element electrically connected with the first source/drain region and one end of the eFuse, the conductive element being oriented in the channel width direction.

In some embodiments, a set of masks corresponds to an integrated circuit layout, the integrated circuit layout comprising an electrical fuse (eFuse) bit cell having a first orientation direction and a second orientation direction perpendicular to the first orientation direction. The eFuse bit cell comprises an eFuse comprising a conduction path along the first orientation direction, a first source/drain region, a second source/drain region, and a conductive element oriented in the second orientation direction and electrically connected with the first source/drain region and one end of the eFuse, wherein the eFuse and the first source/drain region are aligned in the second orientation direction. The set of masks is formed based on the integrated circuit layout.

In some embodiments, a method of generating an integrated circuit layout comprises forming an electrical fuse (eFuse) bit cell having a first orientation direction and a second orientation direction perpendicular to the first orientation direction, forming an eFuse comprising a conduction path along the first orientation direction, delineating a first source/drain region, delineating a second source/drain region, and positioning a conductive element oriented in the second orientation direction and electrically connected with the first source/drain region and an end of the eFuse. The eFuse and the first source/drain region are aligned in the second orientation direction.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A bit cell comprising:
a program device comprising a first source/drain region and a second source/drain region separated by a first channel, the first source/drain region, the second source/drain region, and the first channel being positioned along a first direction;
an electrical fuse (eFuse), the eFuse comprising a conduction path along the first direction; and
a conductive element electrically connected with the first source/drain region and an end of the eFuse.

2. The bit cell of claim 1, wherein the conductive element is part of a first metal layer.

3. The bit cell of claim 1, wherein the conductive element is aligned along a second direction perpendicular to the first direction.

4. The bit cell of claim 1, wherein the conduction path of the eFuse is part of a second metal layer.

5. The bit cell of claim 1, wherein the conduction path of the eFuse is part of a metal-zero layer over polysilicon.

6. The bit cell of claim 1, further comprising a third source/drain region and a fourth source/drain region separated by a second channel, the third source/drain region, the fourth source/drain region, and the second channel being positioned along the first direction,
wherein the first source/drain region is electrically connected with the third source/drain region.

7. The bit cell of claim 1, wherein the first source/drain region and the second source/drain region are part of a first active region, and the bit cell further comprises a second active region electrically connected to a well.

8. The bit cell of claim 7, wherein the second source/drain region is electrically connected with the second active region.

9. An integrated circuit comprising:
a first transistor comprising a first source/drain region and a second source/drain region separated by a channel, the channel having a channel width direction;
an electrical fuse (eFuse) comprising a conduction path perpendicular to the channel width direction; and
a conductive element electrically connected with the first source/drain region and an end of the eFuse, the conductive element being oriented in the channel width direction.

10. The integrated circuit of claim 9, wherein the conductive element is part of a first metal layer of the integrated circuit.

11. The integrated circuit of claim 9, wherein the conduction path of the eFuse is part of a metal-zero layer over polysilicon of the integrated circuit or a second metal layer of the integrated circuit.

12. The integrated circuit of claim 9, further comprising a third source/drain region electrically connected with the first source/drain region, wherein the first source/drain region is between the eFuse and the third source/drain region.

13. The integrated circuit of claim 12, further comprising a second transistor, the second transistor comprising the third source/drain region.

14. A set of masks corresponding to an integrated circuit layout, the integrated circuit layout comprising:
an electrical fuse (eFuse) bit cell having a first orientation direction and a second orientation direction perpendicular to the first orientation direction, the eFuse bit cell comprising:
an eFuse comprising a conduction path along the first orientation direction;
a first source/drain region;
a second source/drain region; and
a conductive element oriented in the second orientation direction and electrically connected with the first source/drain region and an end of the eFuse,
wherein the eFuse and the first source/drain region are aligned in the second orientation direction,
wherein the set of masks is formed based on the integrated circuit layout.

15. The set of masks of claim 14, wherein the conductive element is part of a first metal layer of the integrated circuit layout.

16. The set of masks of claim 14, wherein the eFuse is part of a second metal layer of the integrated circuit layout.

17. The set of masks of claim 14, wherein the eFuse is part of a metal-zero layer over polysilicon of the integrated circuit layout.

18. The set of masks of claim 14, wherein the eFuse bit cell further comprises a third source/drain region aligned in the second orientation direction along with the eFuse and the first source/drain region.

19. The set of masks of claim 18, wherein the conductive element is electrically connected with the third source/drain region.

20. The set of masks of claim 14, wherein the eFuse bit cell further comprises a gate between the first source/drain region and the second source/drain region.

* * * * *